(12) United States Patent
Miura et al.

(10) Patent No.: US 11,772,190 B2
(45) Date of Patent: Oct. 3, 2023

(54) LASER OSCILLATOR SUPPORT TABLE AND ADJUSTMENT METHOD OF LASER OSCILLATOR SUPPORT TABLE

(71) Applicant: DISCO CORPORATION, Tokyo (JP)

(72) Inventors: Seiji Miura, Tokyo (JP); Hiroki Uryu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 371 days.

(21) Appl. No.: 16/894,074

(22) Filed: Jun. 5, 2020

(65) Prior Publication Data

US 2020/0384571 A1 Dec. 10, 2020

(30) Foreign Application Priority Data

Jun. 6, 2019 (JP) ................................. 2019-106263

(51) Int. Cl.
*B23K 26/042* (2014.01)
*B23K 26/02* (2014.01)
(Continued)

(52) U.S. Cl.
CPC ............ *B23K 26/042* (2015.10); *B23K 26/02* (2013.01); *B23K 26/08* (2013.01);
(Continued)

(58) Field of Classification Search
CPC ...... B23K 26/04; B23K 26/042; B23K 26/02; B23K 26/08; B23K 26/035;
(Continued)

(56) References Cited

U.S. PATENT DOCUMENTS 5,253,834 A   10/1993   Sullivan, V et al.

FOREIGN PATENT DOCUMENTS

CN   204053233 U   12/2014
EP   0488033 A2 *  6/1992
(Continued)

OTHER PUBLICATIONS

Search report issued in counterpart Singapore patent application No. 10202005162U , dated Apr. 15, 2021.
(Continued)

*Primary Examiner* — Tu B Hoang
*Assistant Examiner* — Alba T Rosario-Aponte
(74) *Attorney, Agent, or Firm* — Greer Burns & Crain Ltd.

(57) ABSTRACT

A laser oscillator support table includes a base, a fixed plate supported over the base with intermediary of a Z-axis direction movement unit, and a Y-axis direction moving plate mounted on the fixed plate, movable orthogonal to an X-axis direction. An optical path direction of the beam emitted from a laser oscillator supported by the laser oscillator support table is defined as the X-axis direction. The laser oscillator support table further includes a rotating plate that is mounted on the Y-axis direction moving plate rotatably around a rotation center pin fixed to the Y-axis direction moving plate and supports the laser oscillator, a Y-axis direction movement unit that moves the Y-axis direction moving plate in the Y-axis direction, and a rotational movement unit that rotates the rotating plate around the rotation center pin in a plane parallel to a plane formed by the X-axis direction and the Y-axis direction.

5 Claims, 9 Drawing Sheets

(51) Int. Cl.
    *B23K 26/08*     (2014.01)
    *H01L 21/67*     (2006.01)
    *H01L 21/268*     (2006.01)
    *H01L 21/78*     (2006.01)

(52) U.S. Cl.
    CPC .. *H01L 21/67092* (2013.01); *H01L 21/67115* (2013.01); *H01L 21/268* (2013.01); *H01L 21/78* (2013.01)

(58) Field of Classification Search
    CPC ............ B23K 26/0869; B23K 26/0876; B23K 26/0884; B23K 26/10; B23K 26/103
    USPC ............................ 219/121.78, 121.81, 121.6
    See application file for complete search history.

(56) References Cited

FOREIGN PATENT DOCUMENTS

| | | | | |
|---|---|---|---|---|
| JP | 2000012939 | A | * | 1/2000 |
| JP | 2000012939 | A | | 1/2000 |
| JP | 2003320466 | A | | 11/2003 |
| JP | 2004243393 | A | | 9/2004 |
| JP | 2013226576 | A | | 11/2013 |
| KR | 20080090975 | A | * | 10/2008 |
| KR | 20090059902 | A | * | 6/2009 |
| KR | 1020090059902 | A | | 6/2009 |

OTHER PUBLICATIONS

Extended ESR issued in EP Application No. 20 17 8491, dated Oct. 30, 2020.
Office Action in the counterpart European patent application No. 20 178 491.5, dated Oct. 1, 2021.

* cited by examiner

LASER OSCILLATOR SUPPORT TABLE AND ADJUSTMENT METHOD OF LASER OSCILLATOR SUPPORT TABLE

BACKGROUND OF THE INVENTION

Field of the Invention

The present invention relates to a laser oscillator support table that supports a laser oscillator, a laser processing apparatus having a laser oscillator support table, and an adjustment method of a laser oscillator support table.

Description of the Related Art

A laser processing apparatus is known that executes irradiation with a laser beam along planned dividing lines of a semiconductor wafer or the like to execute processing in order to divide the semiconductor wafer into individual device chips (refer to Japanese Patent Laid-open No. 2003-320466, for example).

The laser processing apparatus is equipped with a laser oscillator and has a configuration in which a laser beam emitted from the laser oscillator is propagated to a processing point via optical elements such as a mirror and a lens. To propagate the laser beam to the processing point, optical axis adjustment of the laser oscillator is indispensable. However, the optical axis adjustment is work that is very troublesome and takes a long time because the space in which optical parts are disposed is small in association with reduction in the size of the apparatus and the number of optical parts is large, and so forth (refer to Japanese Patent Laid-open No. 2013-226576, for example).

SUMMARY OF THE INVENTION

If the life of the laser oscillator ends or the laser oscillator breaks down, for example, the laser oscillator mounted in the laser processing apparatus needs to be replaced. However, because the laser oscillator involves individual difference, the position, angle, and so forth of emission of the laser beam are different between the laser oscillator before the replacement and the laser oscillator after the replacement in most cases.

For this reason, after the laser oscillator is replaced, optical axis adjustment to adjust the angle and so forth of optical elements such as a mirror and a lens needs to be executed each time such that the laser beam can be properly propagated to a processing point. As above, it is required to suppress the labor relating to the optical adjustment after replacement of the laser oscillator and so forth.

Thus, an object of the present invention is to provide a laser oscillator support table that can suppress labor relating to optical adjustment after replacement of a laser oscillator and so forth.

Another object of the present invention is to provide an adjustment method of a laser oscillator support table.

A further object of the present invention is to provide a laser processing apparatus including a laser oscillator support table.

In accordance with an aspect of the present invention, there is provided a laser oscillator support table that supports a laser oscillator. The laser oscillator support table includes a base, a fixed plate supported over the base with intermediary of Z-axis direction movement means, a Y-axis direction moving plate mounted on the fixed plate movably in a Y-axis direction orthogonal to an X-axis direction when an optical path direction of a laser beam emitted from the laser oscillator supported by the laser oscillator support table is defined as the X-axis direction, a rotating plate that is mounted on the Y-axis direction moving plate rotatably around a rotation center pin fixed to the Y-axis direction moving plate and supports the laser oscillator, a Y-axis direction movement unit that moves the Y-axis direction moving plate in the Y-axis direction, and a rotational movement unit that rotates the rotating plate around the rotation center pin in a plane parallel to a plane formed by the X-axis direction and the Y-axis direction.

Preferably, the Z-axis direction movement means includes at least three adjusting units configured to be capable of each independently moving in a Z-axis direction, each of the adjusting units includes a column-shaped part that has a recessed part at an upper part thereof and is fixed to the base, a flange part that protrudes from an outer edge of the fixed plate and has a screw hole and is formed integrally with the fixed plate, a screw that screws into the screw hole of the flange part, and a nut that screws to the screw and fixes the fixed plate at a predetermined height relative to the base, and wherein a tilt of the laser oscillator support table with respect to an XY-plane is allowed to be adjusted by adjusting a height of each of the adjusting units.

In accordance with another aspect of the present invention, there is provided an adjustment method of a laser oscillator support table. The laser oscillator support table includes a base, a fixed plate supported over the base with intermediary of Z-axis direction movement means, a Y-axis direction moving plate mounted on the fixed plate movably in a Y-axis direction orthogonal to an X-axis direction when an optical path direction of a laser beam emitted from the laser oscillator supported by the laser oscillator support table is defined as the X-axis direction, a rotating plate that is mounted on the Y-axis direction moving plate rotatably around a rotation center pin fixed to the Y-axis direction moving plate and supports the laser oscillator, a Y-axis direction movement unit that moves the Y-axis direction moving plate in the Y-axis direction, and a rotational movement unit that rotates the rotating plate around the rotation center pin in a plane parallel to a plane formed by the X-axis direction and the Y-axis direction. The adjustment method includes a laser oscillator support step of supporting the laser oscillator by the laser oscillator support table, a first beam position measurement step of disposing a first beam position measurement unit that measures a position of the laser beam at a first position separate from an emission port of the laser oscillator by a predetermined distance and irradiating the first beam position measurement unit with the laser beam from the laser oscillator to measure the position of the laser beam at the first position, and a second beam position measurement step of disposing a second beam position measurement unit that measures the position of the laser beam at a second position that is separate from the emission port of the laser oscillator by a predetermined distance and is different from the first position and irradiating the second beam position measurement unit with the laser beam from the laser oscillator to measure the position of the laser beam at the second position. At least any one of the Y-axis direction movement unit, the Z-axis direction movement means, and the rotational movement unit of the laser oscillator support table is adjusted based on the beam positions measured in the first beam position measurement step and the second beam position measurement step.

In accordance with a further aspect of the present invention, there is provided a laser processing apparatus that irradiates a workpiece with a laser beam to execute processing. The laser processing apparatus includes a laser oscillator support table. The laser oscillator support table includes a base, a fixed plate supported over the base with intermediary of Z-axis direction movement means, a Y-axis direction moving plate mounted on the fixed plate movably in a Y-axis direction orthogonal to an X-axis direction when an optical path direction of the laser beam emitted from the laser oscillator supported by the laser oscillator support table is defined as the X-axis direction, a rotating plate that is mounted on the Y-axis direction moving plate rotatably around a rotation center pin fixed to the Y-axis direction moving plate and supports the laser oscillator, a Y-axis direction movement unit that moves the Y-axis direction moving plate in the Y-axis direction, and a rotational movement unit that rotates the rotating plate around the rotation center pin in a plane parallel to a plane formed by the X-axis direction and the Y-axis direction. The laser processing apparatus further includes a laser beam irradiation unit including the laser oscillator supported by the laser oscillator support table and a light condenser that condenses the laser beam emitted from the laser oscillator, a chuck table that holds the workpiece, and a movement unit that moves the laser beam irradiation unit and the chuck table relatively.

The invention of the present application provides an effect that labor relating to optical adjustment after replacement of a laser oscillator and so forth can be suppressed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will be described in detail below with reference to the drawings. The present invention is not limited by contents described in the following embodiments. Furthermore, in constituent elements described below, what can be easily assumed by those skilled in the art and what are substantially the same are included. Moreover, configurations described below can be combined as appropriate. In addition, various omissions, replacements, or changes of configurations can be executed in such a range as not to depart from the gist of the present invention.

Figure 1:
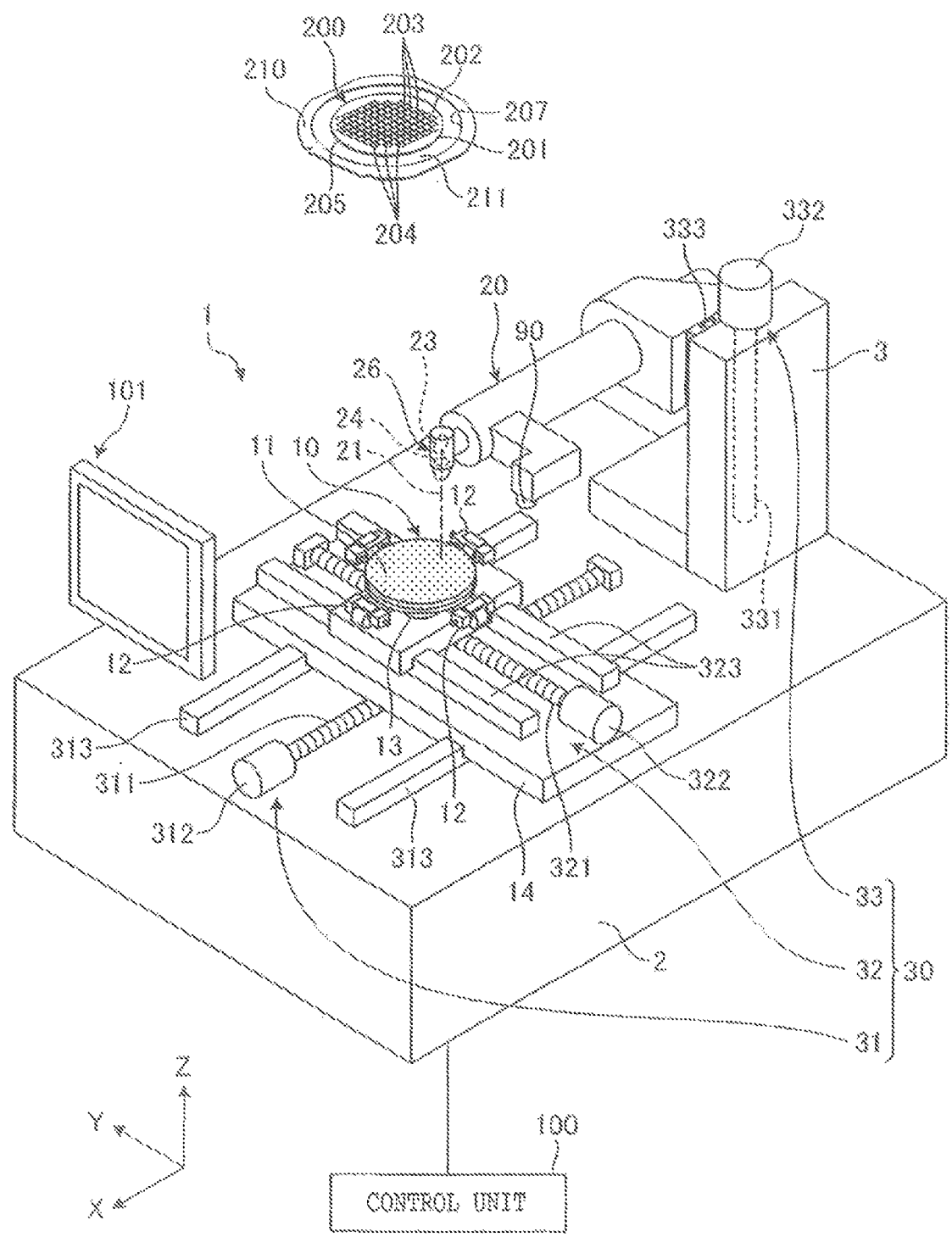
FIG. 1 is a perspective view illustrating a configuration example of a laser processing apparatus according to an embodiment.
Figure 2:
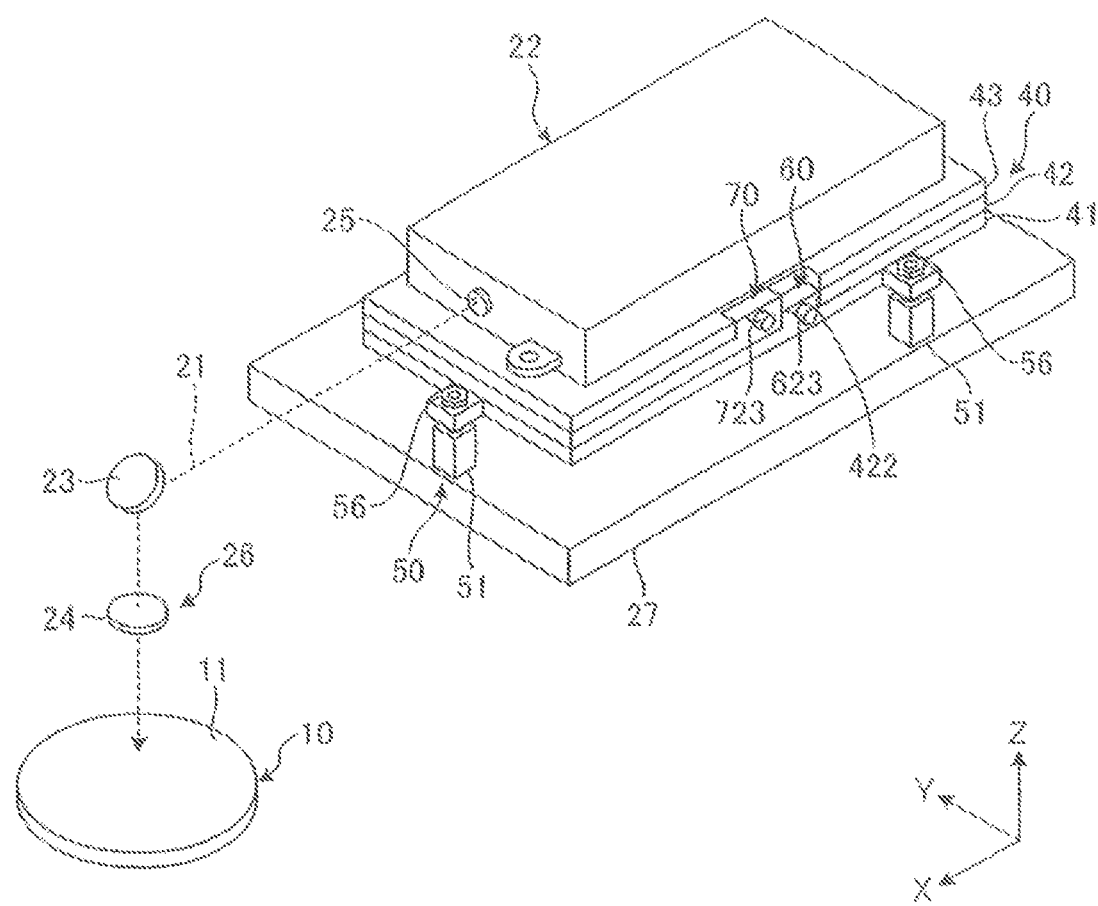
FIG. 2 is a perspective view schematically illustrating a configuration of a laser oscillator support table and a laser beam irradiation unit of the laser processing apparatus illustrated in FIG. 1.

A laser processing apparatus according to an embodiment of the present invention will be described based on the drawings. FIG. 1 is a perspective view illustrating a configuration example of the laser processing apparatus according to the embodiment. FIG. 2 is a perspective view schematically illustrating a configuration of a laser oscillator support table and a laser beam irradiation unit of the laser processing apparatus illustrated in FIG. 1.

(Laser Processing Apparatus)

A laser processing apparatus 1 according to the embodiment is an apparatus that irradiates a workpiece 200 illustrated in FIG. 1 with a laser beam 21 to execute processing. The workpiece 200 that is a processing target of the laser processing apparatus 1 illustrated in FIG. 1 is a circular-disc-shaped semiconductor wafer or optical device wafer having a substrate 201 of silicon, sapphire, gallium arsenide, or the like.

As illustrated in FIG. 1, the workpiece 200 has plural planned dividing lines 203 set in a lattice manner in a front surface 202 of the substrate 201 and devices 204 formed in regions marked out by the planned dividing lines 203. The devices 204 are circuit components such as an integrated circuit (IC) or a large scale integration (LSI) or image sensors of a charge coupled device (CCD), a complementary metal oxide semiconductor (CMOS), or the like, for example.

In the embodiment, for the workpiece 200, a tape 211 to which a ring-shaped frame 210 is stuck and that has a diameter larger than an outer diameter of the workpiece 200 is stuck to a back surface 205 on the back side of the front surface 202. Thus, the workpiece 200 is supported in an opening 207 of the ring-shaped frame 210. In the embodiment, the workpiece 200 is divided into individual devices 204 along the planned dividing lines 203.

As illustrated in FIG. 1, the laser processing apparatus 1 includes a chuck table 10 that holds the workpiece 200 by a holding surface 11, a laser beam irradiation unit 20, a movement unit 30, an imaging unit 90, and a control unit 100.

The chuck table 10 holds the workpiece 200 by the holding surface 11. The holding surface 11 includes porous ceramic or the like and has a circular disc shape and is connected to a vacuum suction source that is not illustrated in the diagram through a vacuum suction path that is not illustrated in the diagram. The chuck table 10 sucks and holds the workpiece 200 supported on the holding surface 11. In the embodiment, the holding surface 11 is a flat surface parallel to a horizontal direction. Around the chuck table 10, plural clamp parts 12 that clamp the ring-shaped frame 210 that supports the workpiece 200 in the opening 207 are disposed. Furthermore, the chuck table 10 is rotated by a rotation unit 13 around an axis center parallel to a Z-axis direction parallel to a vertical direction. The rotation unit 13 and the chuck table 10 are moved in a Y-axis direction by a Y-axis movement unit 32 of the movement unit 30.

The laser beam irradiation unit 20 is a unit that irradiates the workpiece 200 held by the chuck table 10 with the pulse-like laser beam 21. As illustrated in FIG. 1 and FIG. 2, the laser beam irradiation unit 20 has a laser oscillator 22 that emits the laser beam 21 for processing the workpiece 200 from an emission port 25, a mirror 23 that reflects the laser beam 21 emitted from the laser oscillator 22 toward the workpiece 200 held on the holding surface 11 of the chuck table 10, and a light condenser 26 including a condensing lens 24 that focuses the laser beam 21 reflected by the mirror 23 on the workpiece 200.

The laser oscillator 22 is mounted on a laser oscillator support table 40 positioned and fixed onto a pedestal (base) 27. The pedestal 27 is moved in the Z-axis direction parallel to the vertical direction by a Z-axis movement unit 33 of the movement unit 30. The configuration of the laser oscillator support table 40 will be described later.

The light condenser 26 includes the condensing lens 24 that focuses the laser beam 21 reflected by the mirror 23 on the workpiece 200 and focal point position adjusting means that is not illustrated in the diagram and displaces a position of a focal point of the laser beam 21 in the Z-axis direction. The laser beam 21 with which irradiation is executed by the laser beam irradiation unit 20 may have such a wavelength as to be transmitted through the workpiece 200 or may have such a wavelength as to be absorbed by the workpiece 200.

The movement unit 30 is a unit that moves the laser beam irradiation unit 20 and the chuck table 10 relatively. The movement unit 30 includes an X-axis movement unit 31 that moves the chuck table 10 in an X-axis direction that is a direction parallel to the holding surface 11 and is an optical path direction of the laser beam 21 emitted from the laser oscillator 22 when the laser oscillator 22 is supported by the laser oscillator support table 40, the Y-axis movement unit 32 that moves the chuck table 10 in the Y-axis direction that is parallel to the holding surface 11 and is orthogonal to the X-axis direction, and the Z-axis movement unit 33 that moves the laser beam irradiation unit 20 in the Z-axis direction that is orthogonal to the holding surface 11 and is orthogonal to the X-axis direction and the Y-axis direction.

In the embodiment, the Y-axis movement unit 32 and the X-axis movement unit 31 are set on an apparatus main body 2 of the laser processing apparatus 1. The X-axis movement unit 31 supports, movably in the X-axis direction, a moving plate 14 that supports the rotation unit 13 that rotates the chuck table 10 around the axis center parallel to the Z-axis direction. The Y-axis movement unit 32 is disposed on the moving plate 14 and supports the rotation unit 13 and the chuck table 10 movably in the Y-axis direction.

The Z-axis movement unit 33 is set on a column 3 disposed upright from the apparatus main body 2 and supports the light condenser 26 movably in the Z-axis direction. The X-axis movement unit 31, the Y-axis movement unit 32, and the Z-axis movement unit 33 include well-known ball screws 311, 321, and 331 disposed rotatably around the axis center, well-known pulse motors 312, 322, and 332 that rotate the ball screws 311, 321, and 331 around the axis center, and well-known guide rails 313, 323, and 333 that support the moving plate 14, the chuck table 10, or the laser beam irradiation unit 20 movably in the X-axis direction, the Y-axis direction, or the Z-axis direction.

Furthermore, the laser processing apparatus 1 includes an X-axis direction position detecting unit that is for detecting a position of the chuck table 10 in the X-axis direction and is not illustrated in the diagram, a Y-axis direction position detecting unit that is for detecting the position of the chuck table 10 in the Y-axis direction and is not illustrated in the diagram, and a Z-axis direction position detecting unit not shown for detecting a position of the laser beam irradiation unit 20 in the Z-axis direction. Each position detecting unit outputs a detection result to the control unit 100.

The imaging unit 90 is a unit that images the workpiece 200 held by the chuck table 10. The imaging unit 90 includes a CCD camera or infrared camera that images the workpiece 200 held by the chuck table 10. In the embodiment, the imaging unit 90 is fixed to the laser beam irradiation unit 20. The imaging unit 90 images the workpiece 200 and obtains an image for carrying out alignment to execute position adjustment between the workpiece 200 and the laser beam irradiation unit 20 to output the obtained image to the control unit 100.

The control unit 100 is a unit that controls each of the above-described constituent elements of the laser processing apparatus 1 and causes the laser processing apparatus 1 to execute processing operations for the workpiece 200. The control unit 100 is a computer having an arithmetic processing apparatus having a microprocessor such as a central processing unit (CPU), a storing apparatus having a memory such as a read only memory (ROM) or a random access memory (RAM), and an input-output interface apparatus. The arithmetic processing apparatus of the control unit 100 executes arithmetic processing in accordance with a computer program stored in the storing apparatus and outputs a control signal for controlling the laser processing apparatus 1 to the above-described constituent elements of the laser processing apparatus 1 through the input-output interface apparatus to implement functions of the control unit 100.

Furthermore, to the control unit 100, a display unit 101 including a liquid crystal display apparatus or the like that displays a state of processing operations, an image, and so forth and an input unit that is not illustrated in the diagram and is used when an operator registers information on the contents of processing and so forth are connected. The input unit includes at least one of a touch panel set in the display unit 101 and an external input apparatus such as a keyboard.

(Laser Oscillator Support Table)

Figure 3:
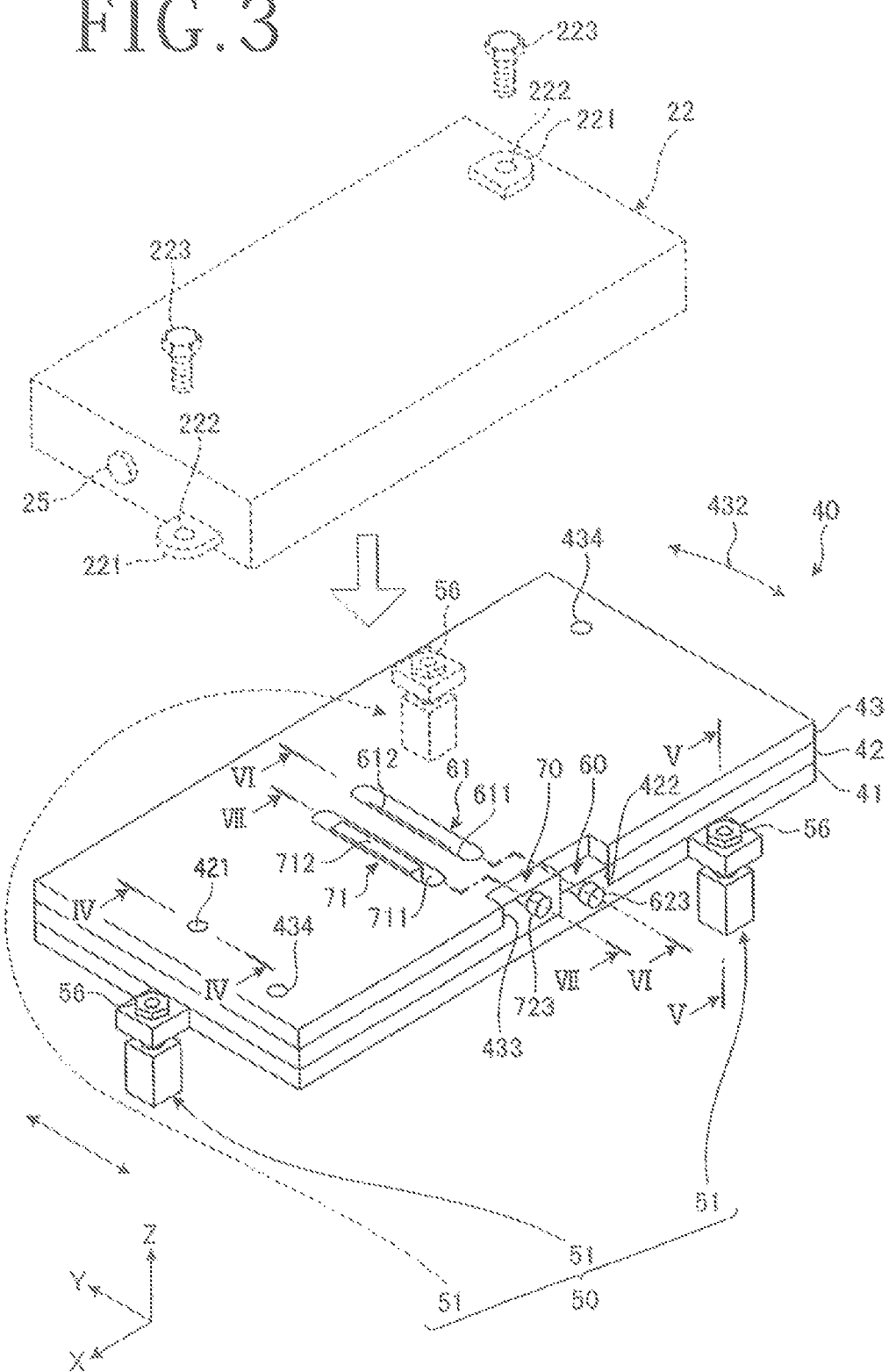
FIG. 3 is a perspective view illustrating a configuration example of the laser oscillator support table according to the embodiment.
Figure 4:
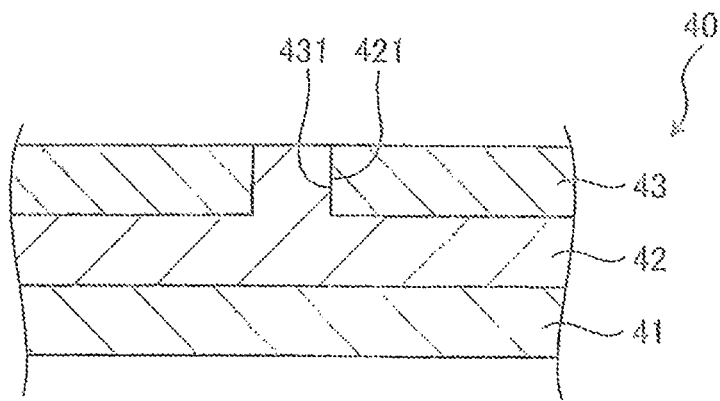
FIG. 4 is a sectional view along line IV-IV in FIG. 3.
Figure 5:
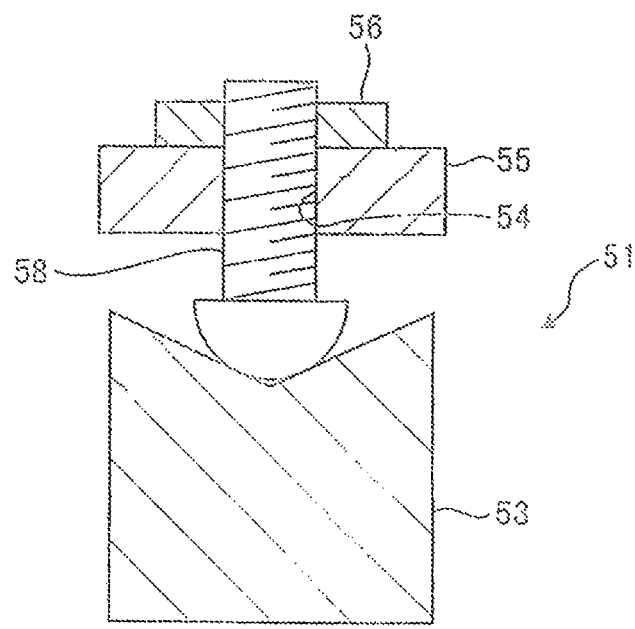
FIG. 5 is a sectional view of Z-axis direction movement means along line V-V in FIG. 3.
Figure 6:
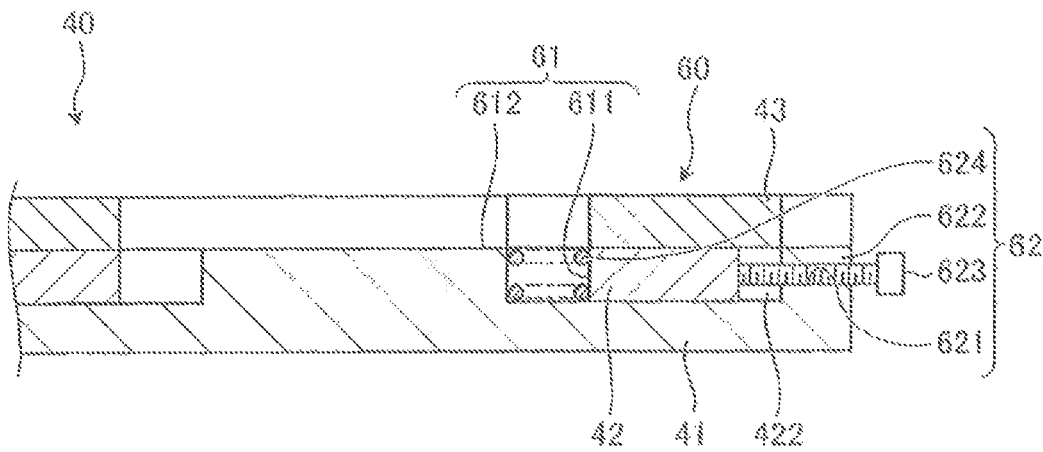
FIG. 6 is a sectional view of a Y-axis direction movement unit along line VI-VI in FIG. 3.
Figure 7:
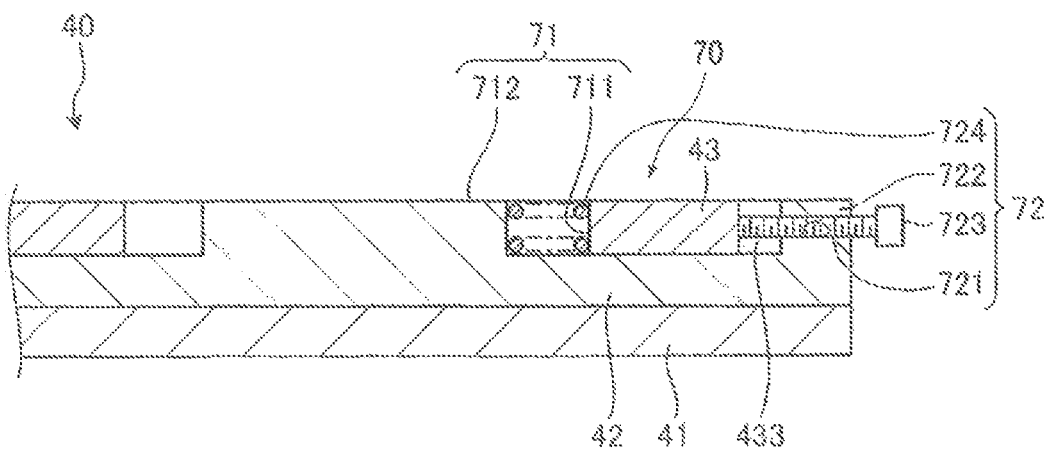
FIG. 7 is a sectional view of a rotational movement unit along line VII-VII in FIG. 3.

The laser oscillator support table according to the embodiment of the present invention will be described based on drawings. FIG. 3 is a perspective view illustrating a configuration example of the laser oscillator support table according to the embodiment. FIG. 4 is a sectional view along line IV-IV in FIG. 3. FIG. 5 is a sectional view of Z-axis direction movement means along line V-V in FIG. 3. FIG. 6 is a sectional view of a Y-axis direction movement unit along line VI-VI in FIG. 3. FIG. 7 is a sectional view of a rotational movement unit along line VII-VII in FIG. 3.

The laser oscillator support table 40 is a component on which the laser oscillator 22 having the emission port 25 at one end part in a longitudinal direction is placed and that may include the pedestal or a base 27 and is positioned and fixed onto the pedestal 27 illustrated in FIG. 2. As illustrated in FIG. 3, the laser oscillator support table 40 includes a base plate or a fixed plate 41, a Y-axis direction moving plate 42, a rotating plate 43, Z-axis direction movement means 50, a Y-axis direction movement unit 60, and a rotational movement unit 70.

The base plate 41, the Y-axis direction moving plate 42, and the rotating plate 43 are flat-plate-shaped members including a metal and are formed into a rectangular shape whose longitudinal direction is parallel to the X-axis direction. The base plate 41 is positioned and supported by the pedestal 27 with the intermediary of the Z-axis direction movement means 50. The Y-axis direction moving plate 42 is overlapped on the base plate 41 and the rotating plate 43 is overlapped on the Y-axis direction moving plate 42. The rotating plate 43 supports the laser oscillator 22 on an upper surface thereof. In the embodiment, in the rotating plate 43, screw holes 434 into which screws 223 that have passed through holes 222 made in flanges 221 of the laser oscillator 22 are screwed are made. The rotating plate 43 fixes the laser oscillator 22 through the screwing of the screws 223 that have passed through the holes 222 into the screw holes 434.

Furthermore, at one end part of the Y-axis direction moving plate 42 in the longitudinal direction on a side of the emission port 25 of the laser oscillator 22, a rotation center pin 421 is disposed upright in parallel to the Z-axis direction toward the rotating plate 43 as illustrated in FIG. 3 and FIG. 4. In the embodiment, the rotation center pin 421 is formed into a circular column shape.

Moreover, at one end part of the rotating plate 43 in the longitudinal direction on the side of the emission port 25 of the laser oscillator 22, a rotation center hole 431 that the rotation center pin 421 enters is made as illustrated in FIG. 4. The planar shape of the rotation center hole 431 is formed into a circular shape whose inner diameter is substantially equal to an outer diameter of the rotation center pin 421. Thus, due to the entry of the rotation center pin 421 into the rotation center hole 431, the Y-axis direction moving plate 42 and the rotating plate 43 are allowed to relatively rotate in an arrow direction 432 illustrated in FIG. 3 around an axis center of the rotation center pin 421 parallel to the Z-axis direction. That is, the rotating plate 43 rotates in a plane parallel to a plane formed by the X-axis direction and the Y-axis direction.

The Z-axis direction movement means 50 is what moves the base plate 41 of the laser oscillator support table 40 in the Z-axis direction and changes a height of the laser oscillator support table 40 from the pedestal 27. In the embodiment, the Z-axis direction movement means 50 includes three adjusting units 51. In the embodiment, one adjusting unit 51 is disposed at one end part of the base plate 41 in the longitudinal direction and two adjusting units 51 are disposed at the other end part, i.e., three adjusting units 51 are disposed in total. These three adjusting units 51 are configured to be capable of each independently moving the base plate 41 in the Z-axis direction.

As illustrated in FIG. 5, the adjusting unit 51 includes a column-shaped part 53 having a recessed part in an upper surface thereof, a screw (so-called kinematic pin) 58 having, in a bottom surface thereof, a projecting part formed to be capable of being placed on the recessed part of the column-shaped part 53, a flange part 55 that is continuous with an outer edge of the base plate 41 and in which a hole 54 that penetrates in the Z-axis direction and allows the screw (kinematic pin) 58 to pass therethrough is formed, and a nut 56 screwed to the screw 58 that has passed through the hole 54 of the flange part 55. A screw groove screwed to the screw 58 is formed in an inner surface of the hole 54. The adjusting unit 51 can adjust a height of the flange part 55 relative to the column-shaped part 53 through rotating the screw (kinematic pin) 58 around an axis center. Furthermore, the nut 56 fixes the height of the flange part 55 finally by screwing to the screw (kinematic pin) 58 that has passed through the hole 54 of the flange part 55. The Z-axis direction movement means 50 can adjust a tilt of the base plate 41 of the laser oscillator support table 40 with respect to the XY-plane formed of the X-axis direction and the Y-axis direction by adjusting the flange parts 55 to heights different from each other relative to the column-shaped parts 53 of the adjusting units 51.

The Y-axis direction movement unit 60 is a unit that moves the Y-axis direction moving plate 42 of the laser oscillator support table 40 in the Y-axis direction relative to the base plate 41, i.e., the pedestal 27. As illustrated in FIG. 6, the Y-axis direction movement unit 60 includes a guide part 61 and an adjusting part 62.

The guide part 61 is a part that allows the Y-axis direction moving plate 42 to move in the Y-axis direction relative to the base plate 41. The guide part 61 includes a long hole 611 that extends in parallel to the Y-axis direction at a central part of the Y-axis direction moving plate 42 in the longitudinal direction and a guide protrusion 612 that is formed integrally with the base plate 41 and is disposed upright from the base plate 41 toward the Y-axis direction moving plate 42 and extends in the Y-axis direction. Widths of the long hole 611 and the guide protrusion 612 are set equal across a whole length, and a length of the long hole 611 in the Y-axis direction is set longer than a length of the guide protrusion 612 in the Y-axis direction. In accordance with the guide part 61, the Y-axis direction moving plate 42 is moved relative to the base plate 41 through expansion and contraction of a spring 624 of the adjusting part 62.

The adjusting part 62 is a part that adjusts a position of the Y-axis direction moving plate 42 in the Y-axis direction relative to the base plate 41. The adjusting part 62 includes an adjustment piece 622 that is disposed upright from an outer edge part of the base plate 41 and enters a cut-out part 422 obtained by cutting out an outer edge part of the Y-axis direction moving plate 42. A screw hole 621 that penetrates in the Y-axis direction is made in the adjustment piece 622. The adjusting part 62 further includes an adjusting screw 623 that screws into the screw hole 621 of the adjustment piece 622 and abuts against a bottom surface of the cut-out part 422 of the Y-axis direction moving plate 42 and the spring 624 that is disposed between the long hole 611 and the guide protrusion 612 and couples the guide protrusion 612 and the Y-axis direction moving plate 42 and moves the Y-axis direction moving plate 42 relative to the base plate 41 as described above.

The Y-axis direction movement unit 60 adjusts the position of the Y-axis direction moving plate 42 in the Y-axis direction relative to the base plate 41 by adjusting an amount of screwing of the adjusting screw 623 into the screw hole 621.

The rotational movement unit 70 is a unit that causes the rotating plate 43 of the laser oscillator support table 40 to rotationally move relative to the base plate 41 and the Y-axis direction moving plate 42, i.e., the pedestal 27, in the direction 432 around the axis center of the rotation center pin 421 parallel to the Z-axis direction, and changes an angle of the rotating plate 43 of the laser oscillator support table 40 around the axis center of the above-described rotation center pin 421. As illustrated in FIG. 7, the rotational movement unit 70 includes a guide part 71 and an adjusting part 72.

The guide part 71 is a part that allows the rotating plate 43 to rotate relative to the Y-axis direction moving plate 42 in the direction 432 around the axis center of the rotation center pin 421 parallel to the Z-axis direction. The guide part 71 includes a long hole 711 that extends in parallel to the Y-axis direction at a central part of the rotating plate 43 in the longitudinal direction and a guide protrusion 712 that is attached to the Y-axis direction moving plate 42 and is disposed upright from the Y-axis direction moving plate 42 toward the rotating plate 43 and extends in the Y-axis direction. A width of the long hole 711 is set larger than a width of the guide protrusion 712 across a whole length, and a length of the long hole 711 in the Y-axis direction is set longer than a length of the guide protrusion 712 in the Y-axis direction. In accordance with the guide part 71, the rotating plate 43 is rotated relative to the Y-axis direction moving plate 42 in the direction 432 around the axis center of the rotation center pin 421 through expansion and contraction of a spring 724 of the adjusting part 72.

The adjusting part 72 is a part that adjusts an angle of the rotating plate 43 with respect to the Y-axis direction moving plate 42 around the axis center of the rotation center pin 421 parallel to the Z-axis direction. The adjusting part 72 includes an adjustment piece 722 that is disposed upright from an outer edge part of the Y-axis direction moving plate 42 and enters a cut-out part 433 obtained by cutting out an outer edge part of the rotating plate 43. A screw hole 721 that penetrates in the Y-axis direction is made in the adjustment piece 722. The adjusting part 72 further includes an adjusting screw 723 that screws into the screw hole 721 of the adjustment piece 722 and abuts against a bottom surface of the cut-out part 433 of the rotating plate 43 and the spring 724 that is disposed between the long hole 711 and the guide protrusion 712 and couples the guide protrusion 712 and the rotating plate 43 and rotates the rotating plate 43 relative to the Y-axis direction moving plate 42 in the direction 432 around the axis center of the rotation center pin 421 as described above.

The rotational movement unit 70 adjusts the angle of the rotating plate 43 around the axis center of the rotation center pin 421 with respect to the Y-axis direction moving plate 42 by adjusting an amount of screwing of the adjusting screw 723 into the screw hole 721.

(Adjustment Method of Laser Oscillator Support Table)

Figure 8:
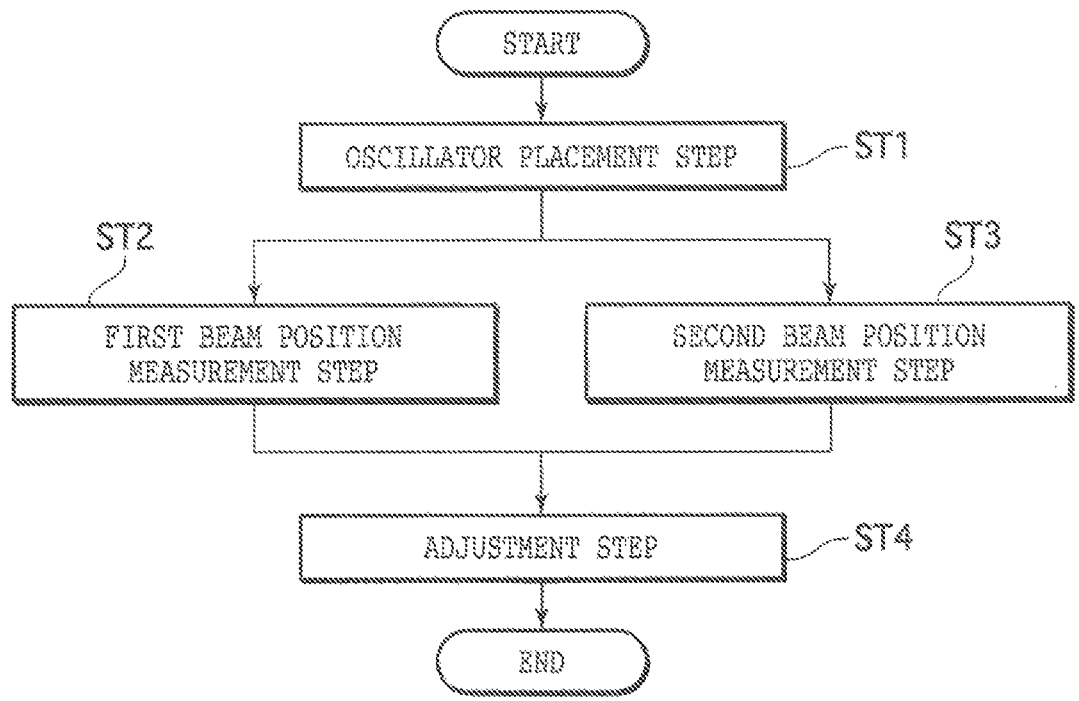
FIG. 8 is a flowchart illustrating a flow of an adjustment method of the laser oscillator support table according to an embodiment.
Figure 9:
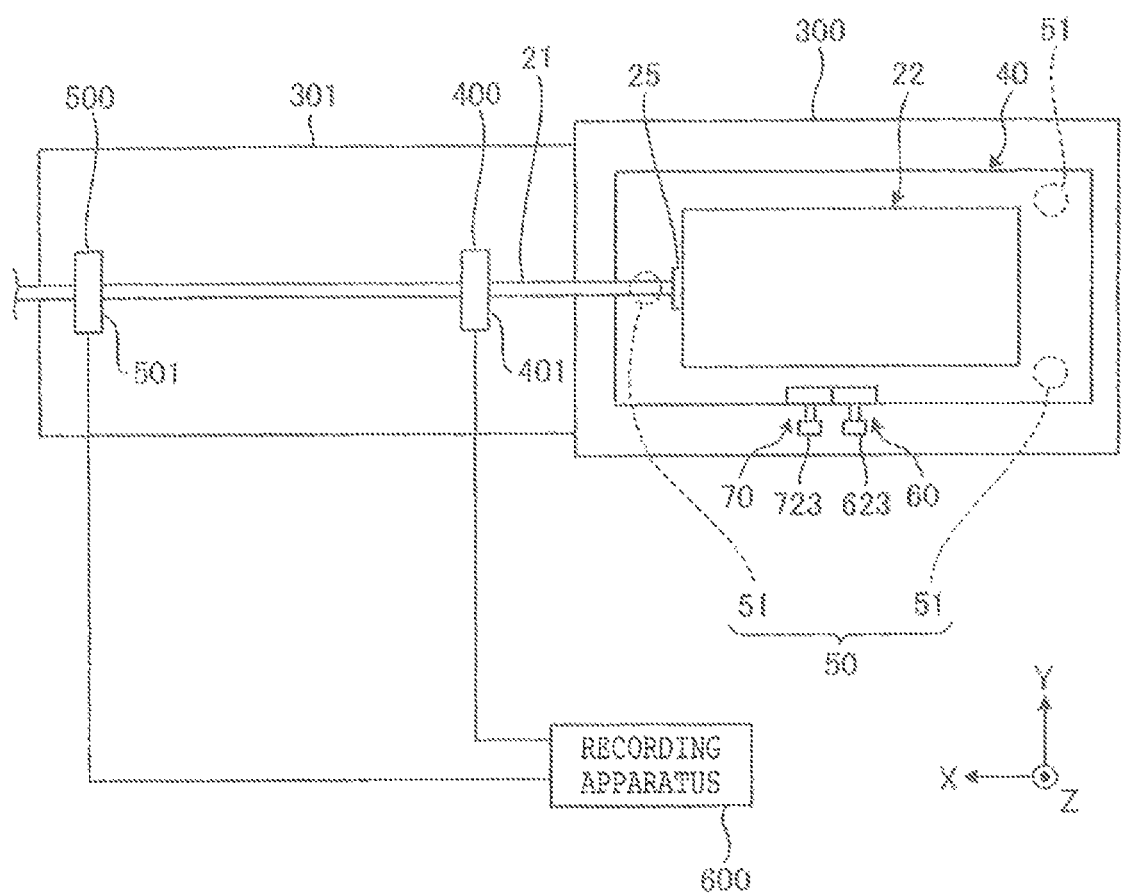
FIG. 9 is a plan view illustrating the laser oscillator support table and so forth in adjustment by the adjustment method of the laser oscillator support table according to the embodiment in FIG. 8.
Figure 10:
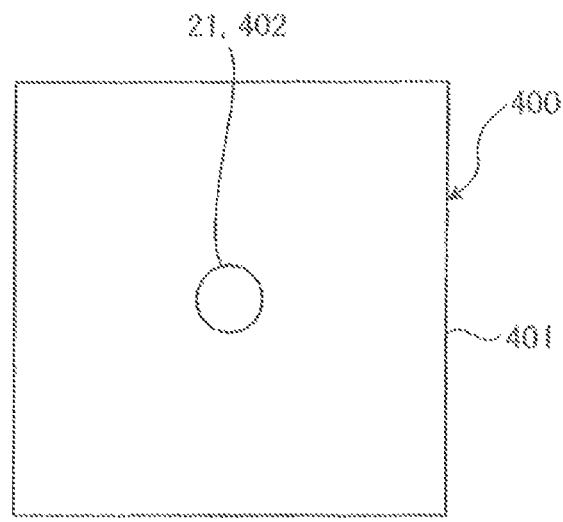
FIG. 10 is a diagram illustrating one example of a light receiving surface of a first beam position measurement unit in adjustment by the adjustment method of the laser oscillator support table according to the embodiment in FIG. 8.
Figure 11:
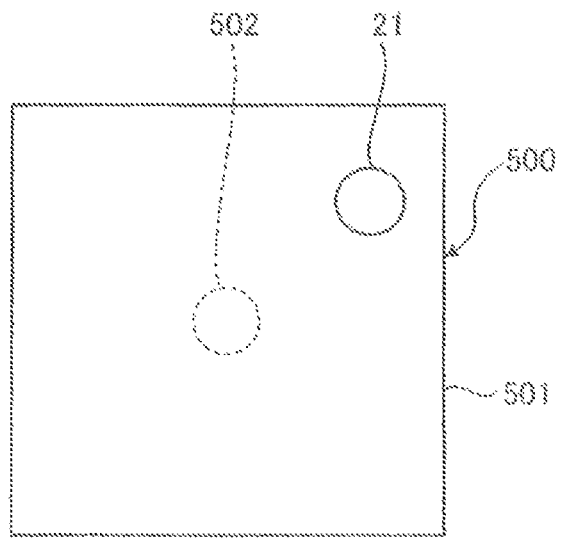
FIG. 11 is a diagram illustrating one example of a light receiving surface of a second beam position measurement unit in adjustment by the adjustment method of the laser oscillator support table according to the embodiment in FIG. 8.

An adjustment method of the laser oscillator support table according to an embodiment of the present invention will be described based on drawings. FIG. 8 is a flowchart illustrating a flow of the adjustment method of the laser oscillator support table according to the embodiment. FIG. 9 is a plan view illustrating the laser oscillator support table and so forth in adjustment by the adjustment method of the laser oscillator support table according to the embodiment in FIG. 8. FIG. 10 is a diagram illustrating one example of a light receiving surface of a first beam position measurement unit in adjustment by the adjustment method of the laser oscillator support table according to the embodiment in FIG. 8. FIG. 11 is a diagram illustrating one example of a light receiving surface of a second beam position measurement unit in adjustment by the adjustment method of the laser oscillator support table according to the embodiment in FIG. 8.

The adjustment method of the laser oscillator support table is a method for adjusting the above-described laser oscillator support table 40 and includes a laser oscillator support step ST1, a first beam position measurement step ST2, a second beam position measurement step ST3, and an adjustment step ST4 as illustrated in FIG. 8.

The laser oscillator support step ST1 is a step of supporting the laser oscillator 22 on the laser oscillator support table 40. In the embodiment, in the laser oscillator support step ST1, the laser oscillator 22 is placed on the rotating plate 43 of the laser oscillator support table 40 and the screws 223 are inserted into the holes 222 and are screwed into the screw holes 434 to fix the laser oscillator 22 to the rotating plate 43 of the laser oscillator support table 40. Furthermore, in the embodiment, in the laser oscillator support step ST1, each adjusting unit 51 of the Z-axis direction movement means 50 of the laser oscillator support table 40 is set on an optical table 300 illustrated in FIG. 9. Then, the process proceeds to the first beam position measurement step ST2 and the second beam position measurement step ST3.

The first beam position measurement step ST2 is a step of disposing a first beam position measurement unit 400 at a first position separate from the emission port 25 of the laser oscillator 22 by a predetermined distance after the laser oscillator support step ST1. The first beam position measurement step ST2 is a step of irradiating the first beam position measurement unit 400 with the laser beam 21 from the emission port 25 of the laser oscillator 22 and measuring a position of the laser beam 21 at the first position.

In the embodiment, the first beam position measurement unit 400 has a light receiving surface 401 that receives the laser beam 21 emitted from the laser oscillator 22. The first beam position measurement unit 400 is a power meter with a pointing function capable of detecting a position irradiated with the laser beam 21 (position at which an output power of the laser beam 21 is the highest) in the light receiving surface 401 illustrated in FIG. 10. However, in the present invention, the first beam position measurement unit 400 may be a profile camera or a photodiode. The first beam position measurement unit 400 outputs information representing the detected position irradiated with the laser beam 21 in the light receiving surface 401 to a recording apparatus 600.

In the embodiment, in the first beam position measurement step ST2, another optical table 301 is set adjacent to the optical table 300 and the first beam position measurement unit 400 is set on this another optical table 301 in such a manner that the light receiving surface 401 is opposed to the emission port 25 of the laser oscillator 22. In the first beam position measurement step ST2, the laser beam 21 is emitted from the emission port 25 of the laser oscillator 22 and the first beam position measurement unit 400 receives the laser beam 21 by the light receiving surface 401 as illustrated in FIG. 10, for example. In the first beam position measurement step ST2, the information representing the position irradiated with the laser beam 21 in the light receiving surface 401, detected by the first beam position measurement unit 400, is output to the recording apparatus 600 and the recording apparatus 600 records the position irradiated with the laser beam 21 in the light receiving surface 401.

The second beam position measurement step ST3 is a step of disposing a second beam position measurement unit 500 at a second position that is separate from the emission port 25 of the laser oscillator 22 by a second predetermined distance and is different from the first position after the laser oscillator support step ST1. The second beam position measurement step ST3 is a step of irradiating the second beam position measurement unit 500 with the laser beam 21 from the emission port 25 of the laser oscillator 22 and measuring the position of the laser beam 21 at the second position.

In the embodiment, the second beam position measurement unit 500 includes a light receiving surface 501 similarly to the first beam position measurement unit 400. In the embodiment, the second beam position measurement unit 500 is a power meter with a pointing function capable of detecting the position irradiated with the laser beam 21

(position at which the output power of the laser beam 21 is the highest) in the light receiving surface 501 similarly to the first beam position measurement unit 400. However, in the present invention, the second beam position measurement unit 500 may be a profile camera or a photodiode. The second beam position measurement unit 500 outputs information representing the detected position irradiated with the laser beam 21 in the light receiving surface 501 to the recording apparatus 600.

In the second beam position measurement step ST3, the second beam position measurement unit 500 is set on the other optical table 301 in such a manner that the light receiving surface 501 is opposed to the emission port 25 of the laser oscillator 22. In the embodiment, the second beam position measurement unit 500 is set at a position more separate from the laser oscillator 22 than the first beam position measurement unit 400. In the second beam position measurement step ST3, the laser beam 21 is emitted from the emission port 25 of the laser oscillator 22 and the second beam position measurement unit 500 receives the laser beam 21 by the light receiving surface 501 as illustrated in FIG. 11, for example. In the second beam position measurement step ST3, the position irradiated with the laser beam 21 in the light receiving surface 501, detected by the second beam position measurement unit 500, is output to the recording apparatus 600 and the recording apparatus 600 records the position irradiated with the laser beam 21 in the light receiving surface 501. Furthermore, in the present invention, without disposing the recording apparatus 600, the adjustment step ST4 may be executed while the positions irradiated with the laser beam 21 in the light receiving surfaces 401 and 501 are visually checked.

The adjustment step ST4 is a step of adjusting at least any one of the Y-axis direction movement unit 60, the Z-axis direction movement means 50, and the rotational movement unit 70 of the laser oscillator support table 40 based on the positions irradiated with the laser beam 21 in the light receiving surfaces 401 and 501, measured in the first beam position measurement step ST2 and the second beam position measurement step ST3. In the adjustment step ST4, based on the positions irradiated with the laser beam 21 in the light receiving surfaces 401 and 501, detected by the beam position measurement units 400 and 500, at least any one of the Y-axis direction movement unit 60, the Z-axis direction movement means 50, and the rotational movement unit 70 is adjusted in such a manner that predetermined positions 402 and 502 (illustrated in FIG. 10 and FIG. 11) set in advance in the light receiving surfaces 401 and 501 are irradiated with the laser beam 21 emitted from the laser oscillator 22. In the embodiment, the predetermined positions 402 and 502 are centers of the light receiving surfaces 401 and 501. However, they are not limited to the centers in the present invention.

In FIG. 10 and FIG. 11, the positions irradiated with the laser beam 21 in the first beam position measurement step ST2 and the second beam position measurement step ST3 are illustrated by solid-line circles and the predetermined positions 402 and 502 that are set in advance and should be irradiated with the laser beam 21 in the light receiving surfaces 401 and 501 are illustrated by dotted-line circles. FIG. 10 illustrates that the position irradiated with the laser beam 21 overlaps with the predetermined position 402, and FIG. 11 illustrates that the position irradiated with the laser beam 21 deviates from the predetermined position 502.

After at least any one of the Y-axis direction movement unit 60, the Z-axis direction movement means 50, and the rotational movement unit 70 is adjusted in such a manner that the predetermined positions 402 and 502 set in advance in the light receiving surfaces 401 and 501 are irradiated with the laser beam 21 in the adjustment step ST4, the adjustment method of the laser oscillator support table ends. The adjusted laser oscillator support table 40 is removed from the optical table 300 and is mounted on the pedestal 27 in the state in which the laser oscillator 22 is fixed thereto.

As described above, with the laser oscillator support table 40 and the adjustment method of the laser oscillator support table according to the embodiments, the laser oscillator support table 40 can adjust the position in the Y-axis direction, the height in the Z-axis direction, the tilt with respect to the XY-plane, and an orientation around the axis center parallel to the Z-axis direction regarding the laser beam 21 emitted from the laser oscillator 22. Due to this, with the laser oscillator support table 40 and the adjustment method of the laser oscillator support table, the laser beam emitted by the laser oscillator 22 supported by the laser oscillator support table 40 can be made to pass through the predetermined position set in advance by adjusting the Y-axis direction movement unit 60, the Z-axis direction movement means 50, and the rotational movement unit 70 in such a manner that the predetermined positions 402 and 502 set in advance in the light receiving surfaces 401 and 501 of the two beam position measurement units 400 and 500 disposed at positions different from each other in the X-axis direction are irradiated with the laser beam 21 in the adjustment step ST4.

For this reason, with the laser oscillator support table 40 and the adjustment method of the laser oscillator support table according to the embodiments, even when the laser oscillator 22 mounted on the laser processing apparatus 1 is replaced, an optical path of the laser beam 21 emitted from the laser oscillator 22 after the replacement can be adjusted in such a manner that the laser beam 21 passes through the same optical path as the laser oscillator 22 before the replacement. As a result, because the laser beam 21 can be made to pass through the same optical path as the laser oscillator 22 before the replacement, troublesome optical axis adjustment becomes unnecessary and the labor relating to optical adjustment after replacement of the laser oscillator 22 and so forth can be suppressed. Consequently, the laser oscillator support table 40 and the adjustment method of the laser oscillator support table according to the embodiments provide not only an effect of allowing reduction in the number of steps for adjustment but also an effect of shortening downtime of the laser processing apparatus 1 to contribute to improvement in the productivity.

Furthermore, in the adjustment method of the laser oscillator support table, the laser oscillator support table 40 on which the laser oscillator 22 is supported is set on the optical table 300 and is adjusted and the laser oscillator support table 40 after the adjustment is mounted in the laser processing apparatus 1 together with the laser oscillator 22. Therefore, the adjustment method provides an effect that troublesome optical axis adjustment becomes unnecessary and labor relating to optical adjustment can be suppressed.

Moreover, the laser processing apparatus 1 includes the above-described laser oscillator support table 40. Therefore, the labor relating to optical adjustment after replacement of the laser oscillator 22 and so forth can be suppressed. This provides not only an effect of allowing reduction in the number of steps for adjustment but also an effect of shortening the downtime to contribute to improvement in the productivity.

Modification Example

Figure 12:
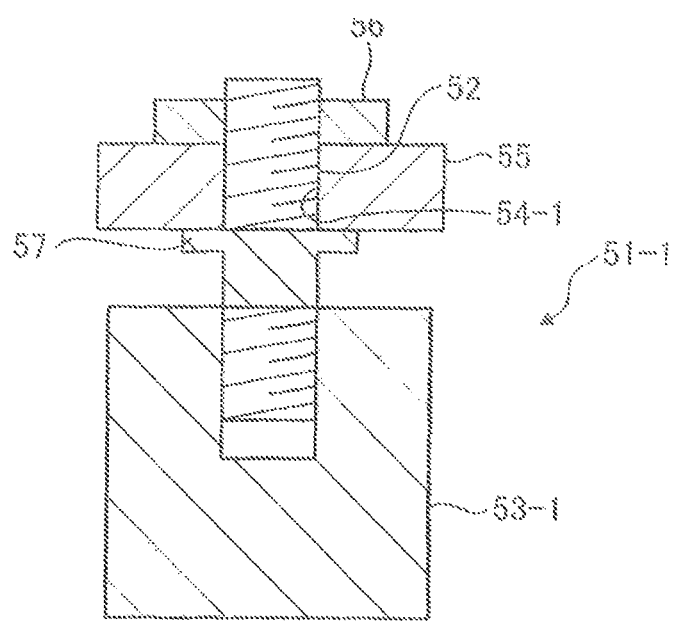
FIG. 12 is a sectional view of an adjusting unit of Z-axis direction movement means of a laser oscillator support table of a laser processing apparatus according to a modification example of the embodiment.

A laser processing apparatus according to a modification example of the embodiment of the present invention will be described based on a drawing. FIG. 12 is a sectional view of an adjusting unit of Z-axis direction movement means of a laser oscillator support table of the laser processing apparatus according to the modification example of the embodiment. The description will be made with the same part as the embodiment being given the same numeral in FIG. 12.

As illustrated in FIG. 12, an adjusting unit 51-1 of Z-axis direction movement means 50 of a laser oscillator support table 40 according to the modification example includes a column-shaped part 53-1 that is set on a pedestal and has a screw hole opened in an upper end surface thereof and a screw 52 that is screwed into the screw hole of the column-shaped part 53-1 and is disposed upright in the Z-axis direction. A flange 57 that protrudes toward an outer circumference is disposed at a central part of the screw 52 in the longitudinal direction. The adjusting unit 51-1 further includes a flange part 55 continuous with an outer edge of the base plate 41. In the flange part 55, a hole 54-1 that penetrates in the Z-axis direction and allows an upper side of the screw 52 relative to the flange 57 to pass therethrough and in which a screw groove is not formed is formed. The adjusting unit 51-1 further includes a nut 56 screwed to the screw 52 that has passed through the hole 54-1 of the flange part 55. The adjusting unit 51-1 can adjust a height of the flange part 55 relative to the column-shaped part 53-1 by rotating the screw 52 around an axis center to thereby make a form in which the screw 52 is buried into the column-shaped part 53-1 and change a height of the flange 57 that supports the flange part 55. Furthermore, the nut 56 fixes the height of the flange part 55 finally by screwing to the screw 52 that has passed through the hole 54-1.

The present invention is not limited to the above-described embodiments. That is, the present invention can be carried out with various modifications without departing from the gist of the present invention. For example, in the present invention, the laser oscillator support table 40 may include an X-axis direction movement unit that moves the supported laser oscillator 22 in the X-axis direction.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser oscillator support table, comprising:
    a base;
    a base plate supported over the base by a Z-axis direction movement means having a plurality of adjusting units, each adjusting unit being configured to independently move the base plate in a Z-axis direction cooperatively with a corresponding flange part formed integrally with, and protruding from, an outer edge of the base plate;
    a Y-axis direction moving plate mounted on the base plate movably in a Y-axis direction orthogonal to an X-axis direction when an optical path direction of a laser beam is defined as the X-axis direction;
    a rotating plate that is mounted on the Y-axis direction moving plate rotatably around a rotation center pin fixed to the Y-axis direction moving plate and supports a laser oscillator;
    a Y-axis direction movement unit that moves the Y-axis direction moving plate in the Y-axis direction; and
    a rotational movement unit that rotates the rotating plate around the rotation center pin in a plane parallel to a plane formed by the X-axis direction and the Y-axis direction,
    wherein an XY-plane of the laser oscillator support table is tilted in a plurality of directions by adjusting a height of the adjusting units in the Z-axis direction.

2. The laser oscillator support table according to claim 1, wherein
    the Z-axis direction movement means includes at least three adjusting units,
    each of the adjusting units includes a column-shaped part that has a recessed part at an upper part thereof and is fixed to the base, a screw that screws into a screw hole in the flange part, and a nut that screws to the screw and fixes the base plate at a predetermined height relative to the base.

3. The laser oscillator support table according to claim 1, wherein
    the Z-axis direction movement means includes at least three adjusting units,
    each of the adjusting units includes a column-shaped part that is fixed to the base and has a screw hole opened in an upper end surface thereof, a screw that has a flange at a central part in a longitudinal direction and screws into the screw hole of the column-shaped part, and inserted into a hole formed in the flange part, and a nut that screws to the screw and clamps the flange part in cooperation with the flange and fixes the base plate at a predetermined height relative to the base.

4. The laser oscillator support table according to claim 1, wherein
    the Y-axis direction movement unit includes a long hole formed in parallel to the Y-axis direction in the Y-axis direction moving plate, a guide protrusion that is formed integrally with the base plate and is inserted in the long hole, a screw that screws into a screw hole formed in the base plate and has a tip that abuts against a side part of the Y-axis direction moving plate, and a spring that is inserted in the long hole and causes the guide protrusion and the Y-axis direction moving plate to be biased in such directions as to get further away from each other.

5. The laser oscillator support table according to claim 1, wherein
    the rotational movement unit includes a long hole formed in parallel to the Y-axis direction at a central part of the rotating plate in a longitudinal direction, a guide protrusion that is formed integrally with the Y-axis direction moving plate and is inserted in the long hole, a screw that screws into a screw hole formed in a side part of the Y-axis direction moving plate and has a tip that abuts against a side part of the rotating plate, and a spring that is inserted in the long hole and causes the guide protrusion and the rotating plate to be biased in such directions as to get further away from each other.

* * * * *